(12) United States Patent
Onda

(10) Patent No.: US 7,557,639 B2
(45) Date of Patent: Jul. 7, 2009

(54) SEMICONDUCTOR DEVICE EMPLOYING STANDBY CURRENT REDUCTION

(75) Inventor: Takamitsu Onda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 30 days.

(21) Appl. No.: 11/735,843

(22) Filed: Apr. 16, 2007

(65) Prior Publication Data

US 2007/0241810 A1    Oct. 18, 2007

(30) Foreign Application Priority Data

Apr. 18, 2006  (JP) .............................. 2006-115029

(51) Int. Cl.
*G05F 1/10* (2006.01)
(52) U.S. Cl. ...................... 327/534; 327/566
(58) Field of Classification Search ................ 327/530, 327/534, 535, 537, 564, 565, 566
See application file for complete search history.

(56) References Cited

U.S. PATENT DOCUMENTS 5,583,457 A * 12/1996 Horiguchi et al. ........... 326/121
5,614,847 A * 3/1997 Kawahara et al. ............. 326/98
6,118,328 A * 9/2000 Morikawa .................... 327/534
6,831,483 B2 * 12/2004 Shimazaki et al. .......... 326/121
7,391,232 B1 * 6/2008 Bose et al. .................... 326/33

FOREIGN PATENT DOCUMENTS

JP            11-31385 A       2/1999

* cited by examiner

*Primary Examiner*—Jeffrey S Zweizig
(74) *Attorney, Agent, or Firm*—Sughrue Mion, PLLC

(57) ABSTRACT

A semiconductor device of the invention comprises a logic circuit to which a power supply voltage, a sub-power supply voltage lower than the power supply voltage, a ground voltage and a sub-ground voltage higher than the ground voltage are supplied; a main power supply line supplying the power supply voltage; and a main ground line supplying the ground voltage. A unit circuit constituting the logic circuit includes first to third PMOS transistors and first to third PMOS transistors. The third PMOS transistor is connected between sources of the first and second PMOS transistors, the main power supply line is connected to its one node, and the sub-power supply voltage is generated at its other node. The third NMOS transistor is connected between sources of the first and second NMOS transistors, the main ground line is connected to its one node, and the sub-ground voltage is generated at its other node.

16 Claims, 9 Drawing Sheets

SEMICONDUCTOR DEVICE EMPLOYING STANDBY CURRENT REDUCTION

BACKGROUND OF THE INVENTION

1. Field of the Invention

The present invention relates to a semiconductor device including a logic circuit configured by MOS transistors, and particularly relates to a semiconductor device employing standby current reduction method for the purpose of reducing current in standby operation for a semiconductor memory device such as a DRAM (Dynamic Random Access Memory).

2. Description of the Related Art

In recent years, semiconductor memory devices such as DRAM have been often installed in mobile devices, and it becomes an important issue to reduce consumption current in standby operation. As a technique for such a reduction in consumption current, attention is directed toward standby current reduction method capable of suppressing sub-threshold current of a MOS transistor using a sub-power supply voltage VCT lower than a power supply voltage VCC and a sub-ground voltage VST higher than a ground voltage VSS. By applying the standby current reduction method to a multi-stage inverter circuit or the like in DRAM, the reduction in consumption current can be expected in standby operation (for example, see Japanese Laid-Open Patent Publication H11-31385).

A specific configuration example of a semiconductor device employing the standby current reduction method is shown in FIGS. 8 and 9. FIG. 8 shows a circuit configuration using MOS transistors corresponding to a two-stage inverter portion when configuring the multi-stage inverter circuit in the semiconductor device employing the standby current reduction method. In FIG. 8, the configuration in which an input signal IN is passed through the two-stage inverters so as to be output as an output signal OUT and the output signal OUT is low in standby operation. In the standby current reduction method, the power supply voltage VCC and the ground voltage VSS are supplied to MOS transistors being on, while the sub-power supply voltage VCT and the sub-ground voltage VST are supplied to MOS transistors being off, and it is thereby possible to suppress unnecessary sub-threshold current.

As shown in FIG. 8, a first-stage inverter includes a pair of a PMOS transistor P1 and an NMOS transistor N1 having commonly connected gates and commonly connected drains. Similarly, a second-stage inverter includes a pair of a PMOS transistor P2 and an NMOS transistor N2 having commonly connected gates and commonly connected drains. The input signal IN is applied to the gate of the first-stage, and the drain of the first-stage is connected to the gate of the second-stage so as to extract the signal OUT from the drain of the second-stage.

A PMOS transistor P3 is used as a driver on the P-channel side, and controls the power supply voltage VCC applied to the source by a control voltage Vgp applied to the gate, so that the sub-power supply voltage VCT lower than the power supply voltage VCC is generated at the drain. On the other hand, an NMOS transistor N3 is used as a driver on the N-channel side, and controls the ground voltage VSS applied to the source by a control voltage Vgn applied to the gate, so that the sub-ground voltage VST higher than the ground voltage VSS is generated at the drain.

In FIG. 8, a main power supply line L1 for supplying the power supply voltage VCC, a main ground line L2 for supplying the ground voltage VSS, a sub-power supply line L3 for supplying the sub-power supply voltage VCT, and a sub-ground line L4 for supplying the sub-ground voltage VST are formed. In standby operation, the input signal IN goes low, and the source of the PMOS transistor P1 being on in the first-stage is connected to the main power supply line L1, while the source of the NMOS transistor N1 being off in the first-stage is connected to the sub-ground line L4. Further, the source of the PMOS transistor P2 being off in the second-stage is connected to the sub-power supply line L3, while the source of the NMOS transistor N2 being on in the second-stage is connected to the main ground line L2.

FIG. 9 shows a layout corresponding to the circuit configuration of FIG. 8. The layout of FIG. 9 includes diffusion layers 101, 102 and 103 in which PMOS transistors P1, P2 and P3 are respectively formed, diffusion layers 104, 105 and 106 in which NMOS transistors N1, N2 and N3 are respectively formed, a gate wiring layer 111 connected to each gate electrode of the transistors, a source/drain wiring layer 112 in which wiring for each source/drain of the transistors is formed, and a wiring layer 113 in which various kinds of wiring including the main power supply line L1, the main ground line L2, the sub-power supply line L3 and the sub-ground line L4 are formed. The diffusion layers 101 to 106 and the source/drain wiring layer 112 are connected through a number of contacts 121, and different wiring layers are connected by vias 122.

In FIG. 9, two PMOS transistors P3 and two NMOS transistors N3 which constitute the drivers are respectively arranged in parallel with each other, which is different from the circuit configuration of FIG. 8. Actually, the numbers of PMOS transistors P3 and the NMOS transistors N3 to be arranged are appropriately determined according to the capability of each driver.

On the left side of FIG. 9, four diffusion layers 101, 102, 104 and 105 which are used to configure the two-stage inverters are formed in sizes corresponding to operation characteristics of the PMOS transistors P1 and P2 and the NMOS transistors N1 and N2, and it is necessary to arrange adjacent diffusion layers 101, 102, 104 and 105 so as to be spaced a predetermined distance apart from one another according to design rules. By this, the area occupied by the inverter portion is restricted in the layout of FIG. 9.

Further, on the right side of FIG. 9, two diffusion layers 103 and 106 which are used to configure the drivers are formed in sizes corresponding to the driving capability, and the extra size is needed in the lateral direction in the layout of FIG. 9. Thus, in the configuration employing the standby current reduction method, the layout area of the driver portion relative to the inverter portion cannot be negligible.

Further, when the standby current reduction method is not employed, only the main power supply line L1 and the main ground line L2 are required to be formed in the wiring layer 113 of FIG. 9. In contrast thereto, when the standby current reduction method is employed, the sub-power supply line L3 and the sub-ground line L4 are required to be formed in addition to the main power supply line L1 and the main ground line L2. Therefore, the area occupied by the wirings of the four power supply lines increases, resulting in a disadvantage in using the layout efficiently.

Thus, according to the conventional configuration employing the standby current reduction method, it is inevitable to increase the area for arranging the drivers and the wirings in the layout of the semiconductor device, and a problem arises that the entire chip size increases.

BRIEF SUMMARY OF THE INVENTION

It is an object of the present invention to provide a semiconductor device capable of realizing excellent space efficiency while avoiding an increase in the layout area for arranging drivers and wiring, even when a logic circuit of the semiconductor device is configured using the standby current reduction method.

An aspect of the present invention is a semiconductor device comprising: a logic circuit including a plurality of MOS transistors to which a power supply voltage and a sub-power supply voltage lower than said power supply voltage are supplied at a power supply side and to which a ground voltage and a sub-ground voltage higher than said ground voltage are supplied to at a ground side; a main power supply line for supplying said power supply voltage; and a main ground line for supplying said ground voltage, wherein a unit circuit constituting said logic circuit includes: a first PMOS transistor; a second PMOS transistor; a third PMOS transistor connected between a source of said first PMOS transistor and a source of said second PMOS transistor, one connection node of which is connected to said main power supply line, while at an other connection node of which said sub-power supply voltage is generated; a first NMOS transistor; a second NMOS transistor; and a third NMOS transistor connected between a source of said first NMOS transistor and a source of said second NMOS transistor, one connection node of which is connected to said main ground line, and at an other connection node of which said sub-ground voltage is generated.

According to the semiconductor device of the present invention, in the unit circuit, the third PMOS transistor functioning as a driver on the P-channel side generates the sub-power supply voltage based on the power supply voltage, and the power supply voltage is supplied to one of the first and second PMOS transistors, while the sub-power supply voltage is supplied to the other one. Further, the third NMOS transistor functioning as a driver on the N-channel side generates the sub-ground voltage based on the ground voltage, and the ground voltage is supplied to one of the first and second NMOS transistors, while the sub-ground voltage is supplied to the other one. In this manner, since MOS transistors required for operation of the logic circuit can be integrally configured with a MOS transistor for the driver, it is not necessary to provide space for arranging the driver separately, and wiring pattern for supplying the sub-power supply voltage and the sub-ground voltage is not required to be individually formed. Accordingly, it is possible to improve space efficiency in the semiconductor device, and to reduce the chip size.

In the present invention, a first diffusion layer in which said third PMOS transistor and said first and second PMOS transistors at opposite sides thereof are arranged; a second diffusion layer in which said third NMOS transistor and said first and second NMOS transistors at opposite sides thereof are arranged; a first wiring layer including a wiring of each gate of said MOS transistors; a second wiring layer including a wiring of each drain/source of said MOS transistors; and a third wiring layer including said main power supply line and said main ground line may be stacked on a semiconductor substrate.

In the present invention, said third PMOS transistor may be arranged at a center of said first diffusion layer, and said third NMOS transistor may be arranged at a center of said second diffusion layer.

In the present invention, in said second wiring layer above said first diffusion layer, a wiring portion shared by said first and third PMOS transistors and a wiring portion shared by said second and third PMOS transistors may be arranged, and in said second wiring layer above said second diffusion layer, a wiring portion shared by said first and third NMOS transistors and a wiring portion shared by said second and third NMOS transistors may be arranged.

In the present invention, said logic circuit may be an inverter circuit of predetermined stages comprising said unit circuit including two stage inverters and a driver for driving the inverters, said third PMOS transistor may function as the driver on a P-channel side, and said third NMOS transistor may function as the driver on a N-channel side.

In the present invention, operation of said third PMOS transistor and said third NMOS transistor may be controlled by a control voltage applied to each gate thereof.

In the present invention, an input signal may be applied to commonly connected gates of said first PMOS transistor and said first NMOS transistor, commonly connected drains of said first PMOS transistor and said first NMOS transistor may be connected to commonly connected gates of said second PMOS transistor and said second NMOS transistor, and an output signal may be output from commonly connected drains of said second PMOS transistor and said second NMOS transistor.

In the present invention, the connected node of said third PMOS transistor at a side of said first PMOS transistor may be connected to said main power supply line, and the connection node of said third NMOS transistor at a side of said second NMOS transistor may be connected to said main ground line.

In the present invention, said inverter circuit may be controlled such that said output signal is low in standby operation.

In the present invention, the connected node of said third PMOS transistor at a side of said second PMOS transistor may be connected to said main power supply line, and the connection node of said third NMOS transistor at a side of said first NMOS transistor may be connected to said main ground line.

In the present invention, said inverter circuit may be controlled such that said output signal is high in standby operation.

Another aspect of the present invention is a semiconductor device comprising: a logic circuit including a plurality of MOS transistors to which a first voltage, a first sub-voltage lower than said first voltage, a second voltage, and a second sub-voltage higher than said second voltage are supplied; a first line for supplying said first voltage; and a second line for supplying said second voltage, wherein a unit circuit constituting said logic circuit includes: a first PMOS transistor; a second PMOS transistor; a third PMOS transistor connected between a source of said first PMOS transistor and a source of said second PMOS transistor, one connection node of which is connected to said first line, while at an other connection node of which said first sub-voltage is generated; a first NMOS transistor; a second NMOS transistor; and a third NMOS transistor connected between a source of said first NMOS transistor and a source of said second NMOS transistor, one connection node of which is connected to said second line, and at an other connection node of which said second sub-voltage is generated.

As described above, according to the present invention, when employing the standby current reduction method in the semiconductor device, a configuration is realized in which MOS transistors required for operation of the logic circuit are integrally arranged with a MOS transistor functioning as the driver and can supply the sub-power supply voltage and the sub-ground voltage via a common wiring portion. Thus, the space for arranging the driver and space for wiring of the sub-power supply voltage and the sub-ground voltage can be reduced. By this, it is possible to realize a semiconductor device which can improve space efficiency in the semiconductor device, and can be configured with a small chip size, by obtaining a merit of the standby current reduction method.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

A preferred embodiment of the present invention will be specifically described below with reference to accompanying drawings. Hereinafter, a case in which the present invention is applied to an inverter circuit formed in a semiconductor device such as DRAM will be described.

Figure 1A:
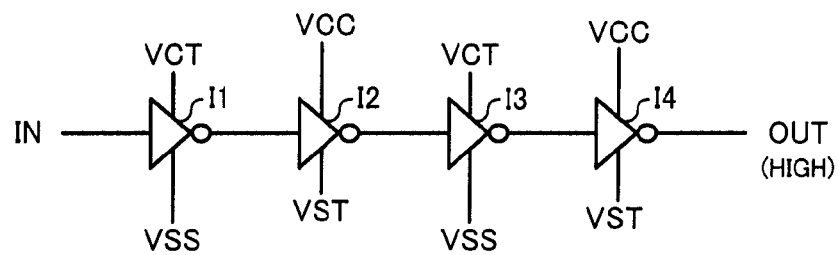
FIGS. 1A and 1B are diagrams showing examples of a multi-stage inverter circuit to which standby current reduction method is applied in an embodiment.
Figure 1B:
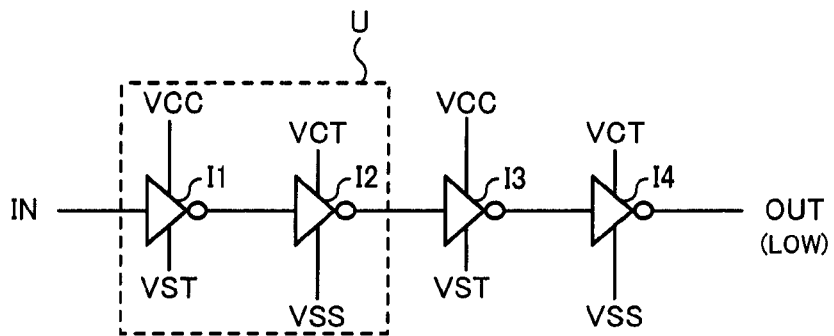

In this embodiment, two configurations as shown in FIGS. 1A and 1B can be assumed respectively as an example of a multi-stage inverter circuit to which the standby current reduction method as described previously is applied. Hereinafter, a case will be described as an example in which a four-stage inverter circuit to which an input signal IN is input and which outputs an output signal OUT is configured using four inverters I1 to I4, and two power supply line systems for a power supply voltage VCC, a ground voltage VSS, a sub-power supply voltage VCT and a sub-ground voltage VST are added thereto.

First, FIG. 1A shows a configuration of the inverter circuit in which the output signal OUT is high in standby operation. In this configuration, the sub-power supply voltage VCT and the ground voltage VSS are supplied to the first-stage and third-stage inverters I1 and I3, and the power supply voltage VCC and the sub-ground voltage VST are supplied to the second-stage and fourth-stage inverters I2 and I4. Meanwhile, FIG. 1B shows a configuration of the inverter circuit in which the output signal OUT is low in standby operation. In this configuration, the power supply voltage VCC and the sub-ground voltage VST are supplied to the first-stage and third-stage inverters I1 and I3, and the sub-power supply voltage VCT and the ground voltage VSS are supplied to the second-stage and fourth-stage inverters I2 and I4, so that the connection of the power supply lines is reverse to that in FIG. 1A.

In this embodiment, among the two configurations of the inverter circuit, the example of the inverter circuit in which the output signal OUT is low in standby operation is mainly described as shown in FIG. 1B. In FIG. 1B, a unit circuit U including the two-stage inverters I1 and I2 is shown. In the semiconductor device of this embodiment, since the multi-stage inverter circuit is formed by arranging the unit circuits U each as one unit repeatedly, a circuit configuration and a layout of the unit circuit U of FIG. 1B will be described in the following.

Figure 2:
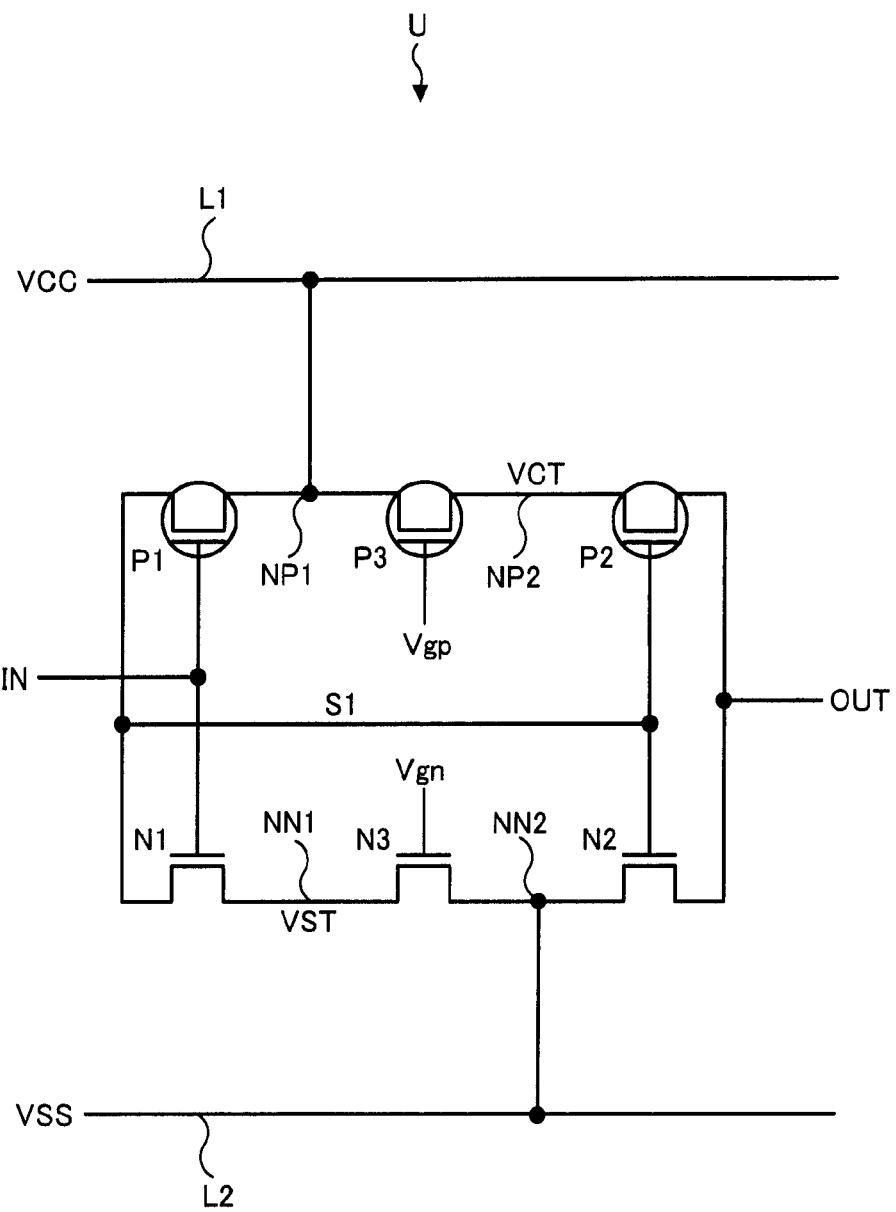
FIG. 2 is a diagram showing a circuit configuration using MOS transistors corresponding to a unit circuit of the inverter circuit of the embodiment.

FIG. 2 shows a circuit configuration using MOS transistors corresponding to the unit circuit U including the first-stage and second-stage inverters I1 and I2 in the inverter circuit of FIG. 1B. The circuit configuration of FIG. 2 includes three PMOS transistors P1, P2 and P3, and three NMOS transistors N1, N2 and N3. Further, a main power supply line L1 for supplying the power supply voltage VCC and a main ground line L2 for supplying the ground voltage VSS are formed.

In the above-mentioned circuit configuration, the PMOS transistor P1 (first PMOS transistor of the invention) and the NMOS transistor N1 (first NMOS transistor of the invention) are paired to form the first-stage inverter I1, and the PMOS transistor P2 (second PMOS transistor of the invention) and the NMOS transistor N2 (second NMOS transistor of the invention) are paired to form the second-stage inverter I2. Further, the PMOS transistor P3 (third PMOS transistor of the invention) functions as a driver on the P-channel side for generating the sub-power supply voltage VCT based on the power supply voltage VCC, and the NMOS transistor N3 (third NMOS transistor of the invention) functions as a driver on the N-channel side for generating the sub-ground voltage VST based on the ground voltage VSS.

In the first-stage PMOS transistor P1 and the NMOS transistor N1, the input signal IN is input to commonly connected gates thereof, and a signal S1 having an opposite phase to that of the input signal IN is output from commonly connected drains thereof. Meanwhile, in the second-stage PMOS transistor P2 and the NMOS transistor N2, the signal S1 is input to commonly connected gates thereof, and the output signal OUT having the same phase as the input signal IN is output from commonly connected drains thereof.

Figure 8:
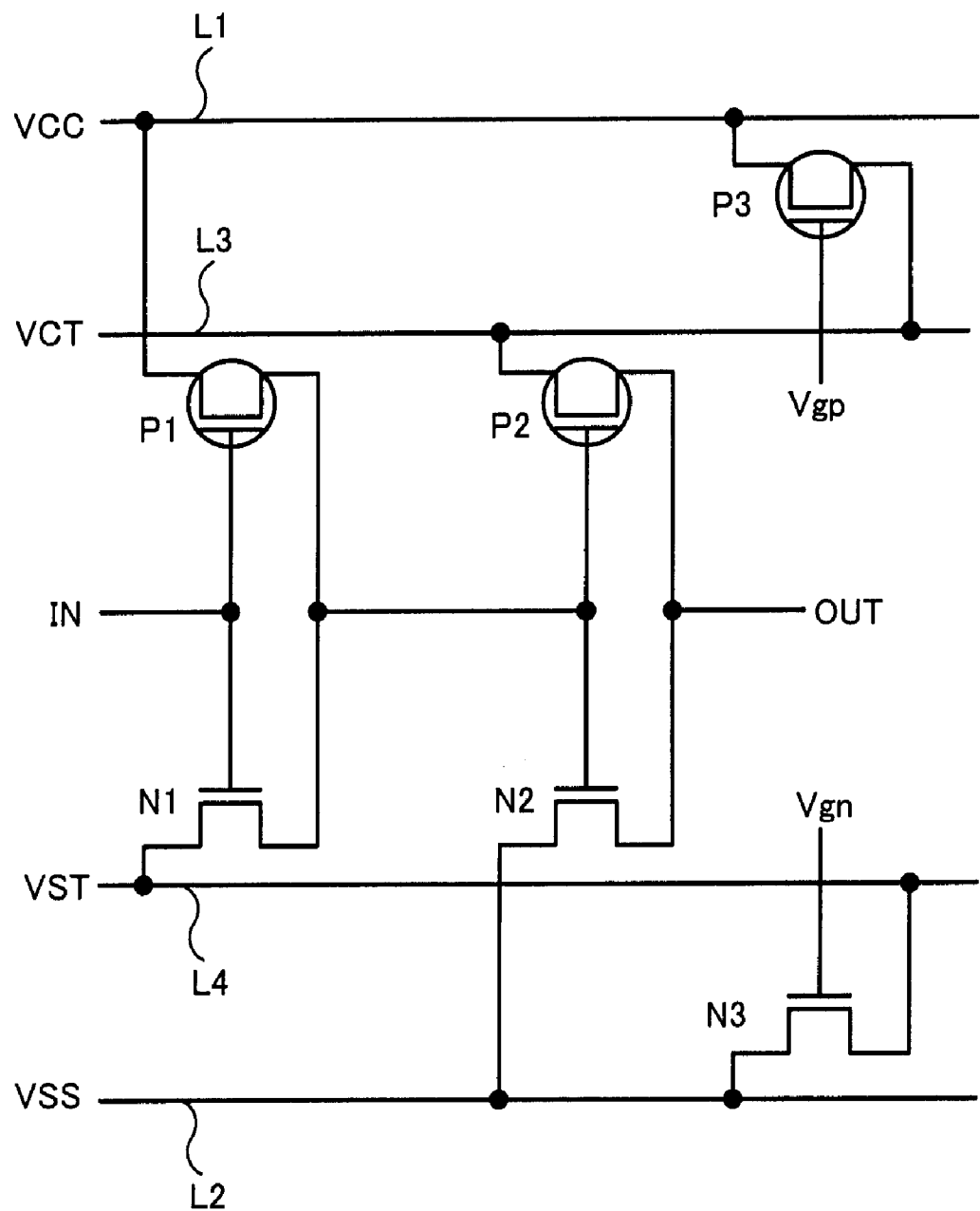
FIG. 8 is a diagram showing a circuit configuration using MOS transistors corresponding to a unit circuit of a conventional inverter circuit.
Figure 9:
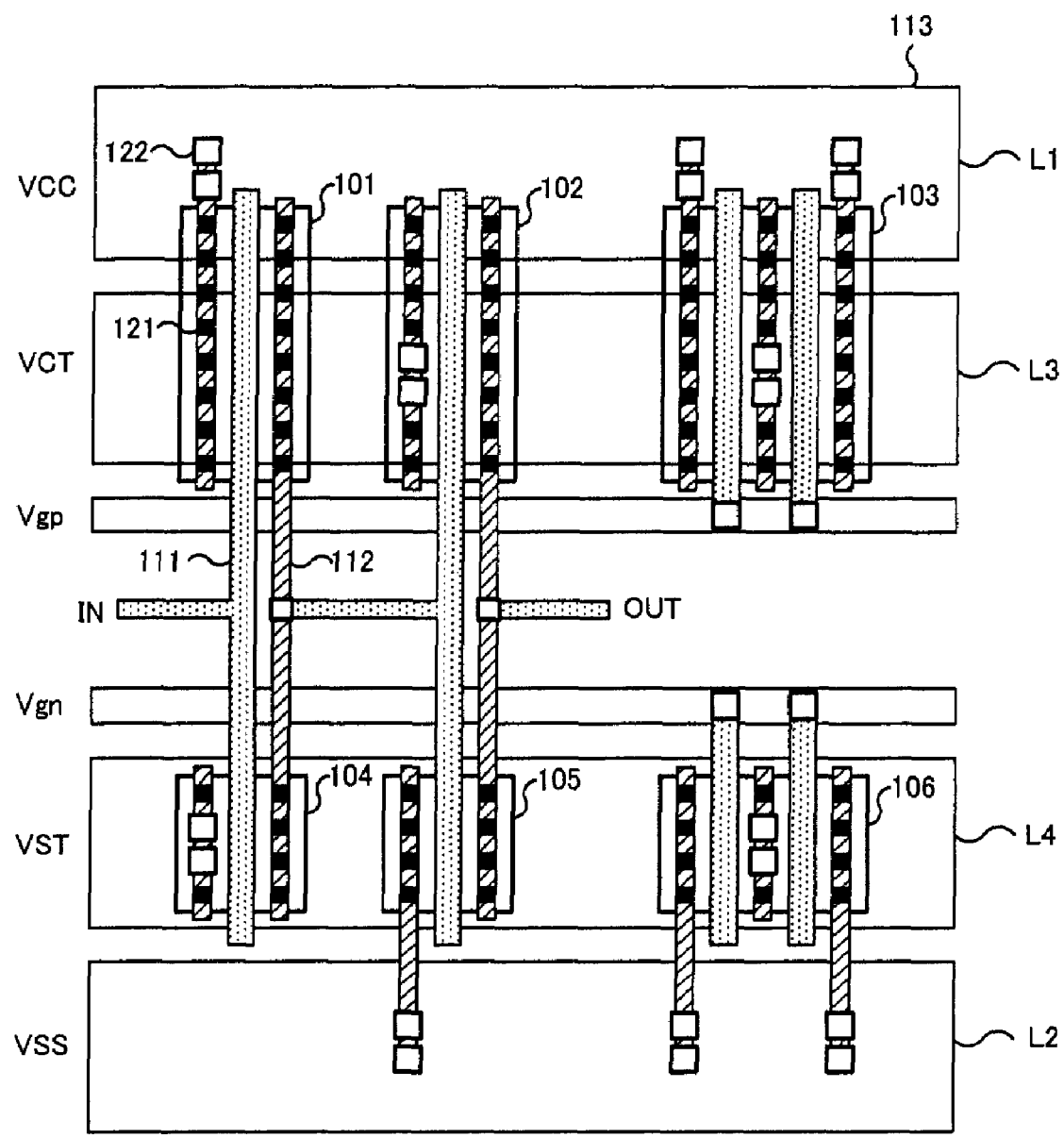
FIG. 9 is a diagram showing a layout corresponding to the circuit configuration of FIG. 8.

As distinct from FIG. 8, a feature of this embodiment is that the PMOS transistor P3 which is the driver on the P-channel side and the NMOS transistor N3 which is the driver on the N-channel side are connected between the two-stage inverters I1 and I2 and thus combined integrally with the inverter circuit. In other words, the source of the PMOS transistor P3 is connected to the source of the PMOS transistor P1 via a node NP1, while the drain thereof is connected to the source of the PMOS transistor P2 via a node NP2. And the source of the NMOS transistor N3 is connected to the source of the NMOS transistor N2 via a node NN2, while the drain thereof is connected to the source of the NMOS transistor N1 via a node NN1. Further, the node NP1 is connected to the main power supply line L1, while the node NN2 is connected to the main ground line L2.

The drivers on the P-channel and N-channel sides are controlled from the outside in response to respective control voltages Vgp and Vgn. In normal operation (in non-standby operation), when operating the driver on the P-channel side, the control voltage Vgp which is applied to the gate of the PMOS transistor P3 is made high in order to generate the sub-power supply voltage VCT (corresponding to VCC) at the drain thereof. Meanwhile, when operating the driver on the N-channel side, the control voltage Vgn which is applied to the gate of the NMOS transistor N3 is made high in order to generate the sub-ground voltage VST (corresponding to VSS) at the drain thereof. In addition, respective drivers can be halted at the time of standby by making the control voltage Vgp high and making the control voltage Vgn low, so as to generate the sub-power supply voltage VCT (<VCC) and the sub-ground voltage VST (>VSS).

In the configuration of FIG. 2, the respective drivers on the P-channel and N-channel sides can realize the two power supply line systems as shown in FIG. 1 when the control voltage Vgp is controlled to be high and the control voltage Vgn is controlled to be low. In this case, the sub-power supply voltage VCT lower than the power supply voltage VCC is generated at the node NP2 on the P-channel side, and the sub-ground voltage VST higher than the ground voltage VSS is generated at the node NN1 on the N-channel side.

Next, a layout corresponding to the circuit configuration of FIG. 2 will be described using FIG. 3. In the layout as shown in FIG. 3, are stacked a diffusion layer 11 (first diffusion layer of the invention) on the P-channel side and a diffusion layer 12 (second diffusion layer of the invention) on the N-channel side each formed on a semiconductor substrate, a gate wiring layer 21 (first wiring layer of the invention) connected to each gate electrode of MOS transistors, a source/drain wiring layer 22 (second wiring layer of the invention) connected to each source/drain of MOS transistors, and a wiring layer 23 (third wiring layer of the invention) in which the main power supply line L1, the main ground line L2 and wirings Lp and Ln of the control voltages Vgp and Vgn for the drivers are formed.

In the diffusion layer 11 on the P-channel side, the PMOS transistor P3 arranged at the center and the PMOS transistors P1 and P2 arranged at opposite sides thereof are formed. The source/drain wiring layer 22 and the gate wiring layer 21 are alternately arranged in parallel over the diffusion layer 11, and as viewed from the left side in FIG. 3, a wiring portion Wp1 and a wiring portion Wp2 above the PMOS transistor P1, a wiring portion Wp3 corresponding to the node NP1, a wiring portion Wp4 of the PMOS transistor P3, a wiring portion Wp5 corresponding to the node NP2, and a wiring portion Wp6 and a wiring portion Wp7 of the PMOS transistor P2 are arranged in this order.

Figure 3:
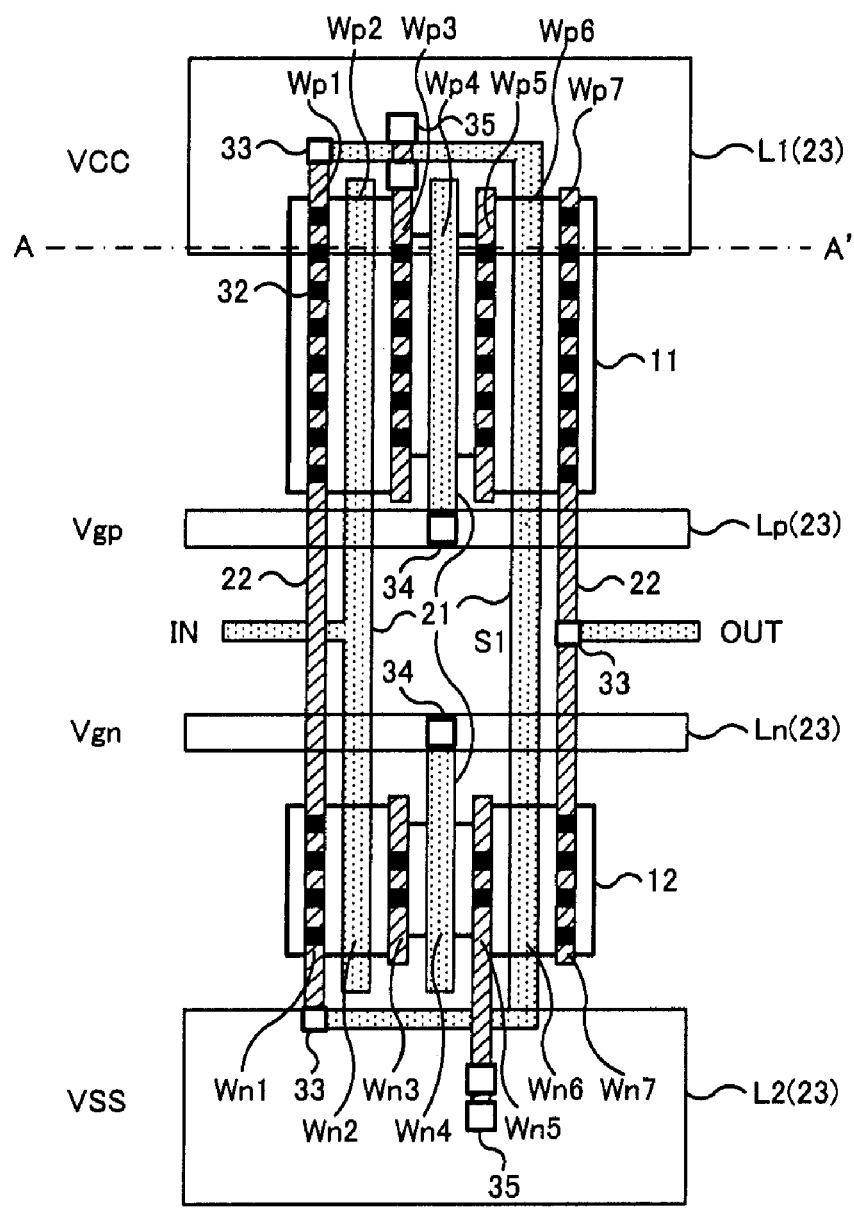
FIG. 3 is a diagram showing a layout corresponding to the circuit configuration of FIG. 2.
Figure 4:
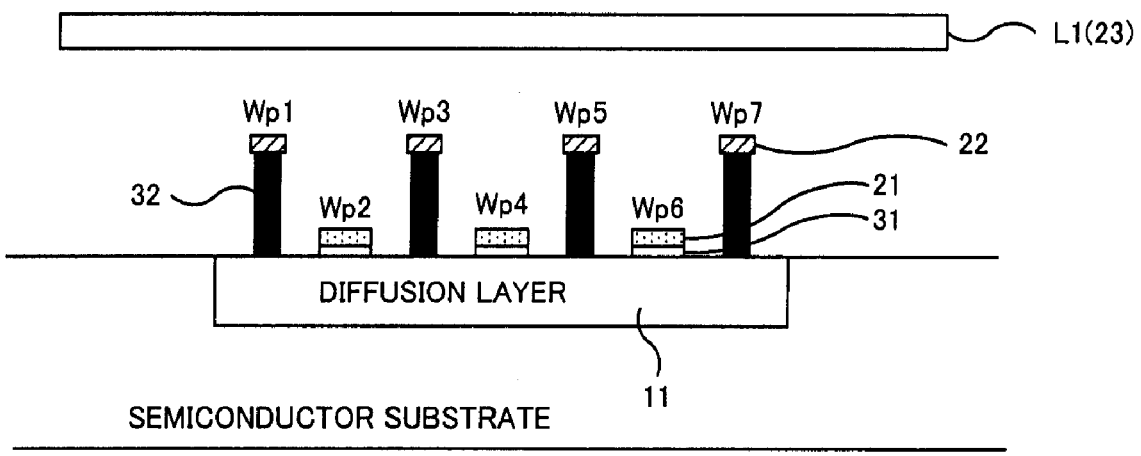
FIG. 4 is a cross-sectional view corresponding to the layout of FIG. 3.

Herein, a cross-sectional structure corresponding to the layout of FIG. 3 is shown in FIG. 4. FIG. 4 is a view of the cross-sectional structure at cross section A-A' of FIG. 3, in which three wiring portions Wp2, Wp4 and Wp6 in the gate wiring layer 21 are formed as gate electrodes placed above the diffusion layer 11 on the lower semiconductor substrate via an insulating film 31. The gate width and the gate length of each of wiring portions Wp2, Wp4 and Wp6 is determined according to sizes thereof and the size of the diffusion layer 11.

Four wiring portions Wp1, Wp3, Wp5 and Wp7 in the source/drain wiring layer 22 are arranged above the diffusion layer 11 and the gate wiring layer 21, and are connected to the diffusion layer 11 via a number of opened contacts 32 with predetermined size and pitch. Further, the wiring layer 23 is formed above the source/drain wiring layer 22, and a pattern of the main power supply line L1 for the power supply voltage VCC is formed at a position of A-A' cross section of FIG. 3.

As shown in FIG. 3, different wiring layers are connected via contacts 33 and vias 35 in the vertical direction. That is, the contacts 33 for connecting between the gate wiring layer 21 and the source/drain wiring layer 22, and the vias 35 for connecting between the source/drain wiring layer 22 and the wiring layer 23 are respectively formed. Further, positions over which the contact 33 and the via 35 are arranged overlapping with each other are shown as connection portions 34 to connect between the gate wiring layer 21 and the wiring layer 23. Generally, polysilicon wiring is used for the gate wiring layer 21, and metal wiring is used for the source/drain wiring layer 22 and the wiring layer 23.

Next, in the diffusion layer 12 on the N-channel side, the NMOS transistor N3 arranged at the center and the NMOS transistors N1 and N2 arranged at opposite sides thereof are formed. In the same manner as the diffusion layer 11, the source/drain layer 22 and the gate layer 21 are alternately arranged in parallel over the diffusion layer 12, and as viewed from the left side in FIG. 3, a wiring portion Wn1 and a wiring portion Wn2 of the NMOS transistor N1, a wiring portion Wn3 corresponding to the node NN1, a wiring portion Wn4 of the NMOS transistor N3, a wiring portion Wn5 corresponding to the node NN2, and a wiring portion Wn6 and a wiring portion Wn7 of the NMOS transistor N2, are arranged in this order.

The arrangement of each wiring above the diffusion layer 12 on the N-channel side is substantially common to the diffusion layer 11 on the P-channel side. However, the width of the diffusion layer 12 on the N-channel side is smaller than that of the diffusion layer 11 on the P-channel side. This is because the NMOS transistor has a higher current supply capability than the PMOS transistor having the same size. In addition, both on the P-channel and N-channel sides, concave shapes are formed on opposite sides near each center of the diffusion layers 11 and 12 so that widths thereof are narrow, as it will described later.

As shown in FIG. 3, in the gate wiring layer 21, the wiring portion Wp2 on the P-channel side and the wiring portion Wn2 on the N-channel side are commonly connected, and to which a wiring pattern of the input signal IN is connected. The wiring portion Wp6 on the P-channel side and the wiring portion Wn6 on the N-channel side are also commonly connected.

Meanwhile, in the source/drain wiring layer 22, the wiring portion Wp1 on the P-channel side and the wiring portion Wn1 on the N-channel side are commonly connected. The wiring portion Wp7 on the P-channel side and the wiring portion Wn7 on the N-channel side are also commonly connected, and to which a wiring pattern of the output signal OUT is connected. The wiring pattern of the output signal OUT is connected to a wiring pattern of an input signal for a subsequent-stage circuit.

In addition, the wiring portion Wp1 and the wiring portion Wp6 are connected, and the wiring portion Wn1 and the wiring portion Wn6 are connected, respectively via the above-mentioned contacts 33 therebetween.

The wiring Lp to which the control voltage Vgp is supplied and the wiring Ln to which the control voltage Vgn is supplied are formed in a position near the center of the wiring layer 23. Then, the wiring portion Wp4 and the wiring Lp are connected, and the wiring portion Wn4 and the wiring Ln are connected, respectively via the above-mentioned contacts 33 and the vias 35.

Further, at upper and lower positions of the wiring layer 23 in FIG. 3, wiring patterns corresponding to the main power supply line L1 and the main ground line L2 having sufficient sizes to supply the power supply voltage VCC and the ground voltage VSS are formed in parallel with each other. The wiring portion Wp3 and the main power supply line L1 are connected, and the wiring portion Wn5 and the main ground line L2 are connected, respectively via the above-mentioned vias 35.

In this manner, the layout of FIG. 3 corresponding to the circuit configuration of FIG. 2 is formed, and the two-stage inverter circuit can be placed in a sufficiently narrow area as compared with FIG. 8. The three PMOS transistors P1, P2 and P3 can be integrally formed using the diffusion layer 11 on the P-channel side, and the three NMOS transistors N1, N2 and N3 can be integrally formed using the diffusion layer 12 on the N-channel side. In this case, on the P-channel side, the wiring portion Wp3 is shared as wiring for each source of the two PMOS transistors P1 and P3, and the wiring portion Wp5 is shared as wiring for the drain of the of the PMOS transistor P3 and the source of the PMOS transistor P2. Meanwhile, on the N-channel side, the wiring portion Wn3 is shared as wiring for the source of the NMOS transistor N1 and the drain of the NMOS transistor N3, and the wiring portion Wn5 is shared as wiring for each source of the two NMOS transistors N2 and N3.

By employing the layout of FIG. 3, it is possible to improve the space efficiency. First, since the inverters I1 and I2 and the drivers are integrally formed, the three MOS transistors can be arranged in each of the diffusion layers 11 and 12, so that the number of diffusion layers is decreased. Second, since adjacent transistors in each of the diffusion layers 11 and 12 can share the wiring portions (Wp3, Wp5, Wn3 and Wn5), the size thereof is correspondingly reduced. According to these results, it is possible to reduce the entire layout area to form the inverter circuit.

Further, in the layout of FIG. 3, the wiring of the sub-power supply voltage VCT and the sub-ground voltage VST can be formed using the wiring portions Wp5 and Wn3 above the diffusion layers 11 and 12. Therefore, the wiring patterns of the sub-power supply voltage VCT and the sub-ground voltage VST need not be formed in the wiring layer 23 and space for other wirings or the like increases.

In addition, in the case of increasing the number of stages of the inverter circuit, the layout of FIG. 3 may be arranged repeatedly. The layout of FIG. 3 corresponds to the two-stage inverter circuit, and therefore, when forming a 2N-stage inverter circuit, the area almost N times the layout of the FIG. 3 is required.

Figure 5A:
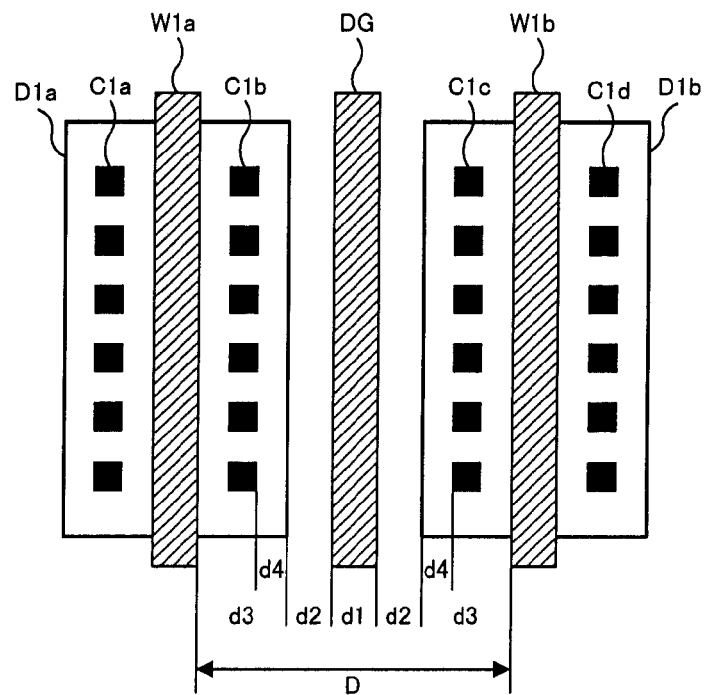
FIGS. 5A and 5B are diagrams explaining the size of the inverter circuit in comparison with the conventional case.
Figure 5B:
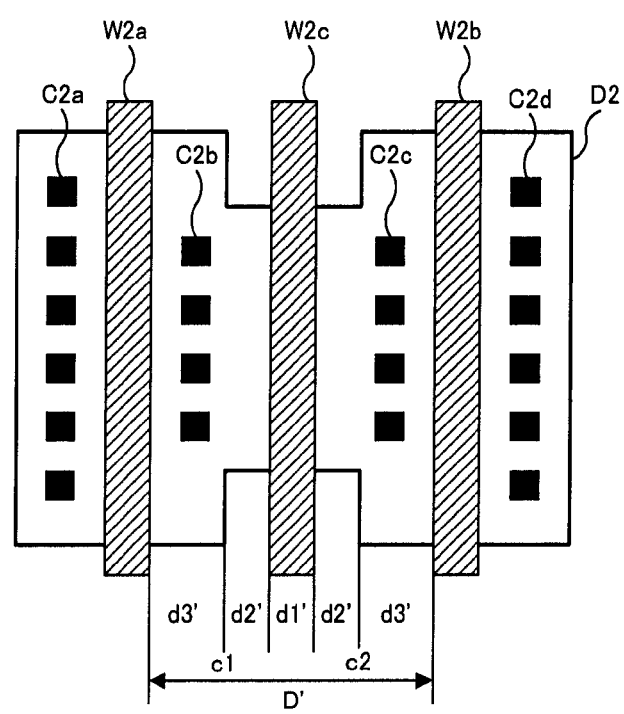

Herein, attention is directed toward the size of the inverter circuit of this embodiment, and description will be made in comparison with the conventional case using FIGS. 5A and 5B. In FIGS. 5A and 5B, it is assumed to use the same manufacturing process in the configuration of this embodiment and the conventional configuration in the case of forming a layout corresponding to the inverter portions on the P-channel and N-channel sides. FIG. 5A shows a planar structure around two diffusion layers D1a and D1b included in the conventional layout, and FIG. 5B shows a planar structure around a single diffusion layer D2 included in the layout of this embodiment. Regarding the diffusion layer D2 of FIG. 5B, description for both the diffusion layers 11 and 12 on the P-channel and N-channel sides will be commonly made below.

In FIG. 5A, the two diffusion layers D1a and D1b, two wiring portions W1a and W1b in the gate wiring layer 21, a dummy gate DG, and four contact lines C1a, C1b, C1c and C1d on a source/drain region are shown. Among these, the two wiring portions W1a and W1b at opposite sides are to be gate electrodes of MOS transistors for the inverter, and the dummy gate DG at the center is disposed in a region between the diffusion layers D1a and D1b where the MOS transistors are not formed, and is required to ensure dimension accuracy of the wiring portions W1a and W1b for gates in the manufacturing process.

Accordingly, the distance D between the wiring portions W1a and W1b at opposite sides is given as described below, using a line width d1 of the dummy gate DG, a gap d2 between the dummy gate DG and the diffusion layers D1a or D1b, and a distance d3 from the internal side of the wiring portions W1a or W1b to the end of the diffusion layers D1a or D1b.

$$D = d1 + 2 \cdot d2 + 2 \cdot d3$$

Basically, the obtained value of the distance D is restricted by conditions of the manufacturing process and performance of the MOS transistors.

Meanwhile, in FIG. 5B, the diffusion layer D2, three wiring portions W2a, W2b and W2c in the gate wiring layer 21, and four contact lines C2a, C2b, C2c and C2d on a source/drain region are shown. As shown in FIG. 5B, the diffusion layer D2 and the wiring portion W2c for the driver above the diffusion layer D2 are arranged in the position corresponding to the dummy gate DG of FIG. 5A.

Accordingly, the distance D' between the wiring portions W2a and W2b for the inverter at opposite sides is given as described below, using a line width d1' of the wiring portion W2c for the driver, a gap d2' between the wiring portion W2c and each of the opposite ends c1 and c2 having a concave shape in the diffusion layer D2, and a distance d3' from the internal side of the wiring portions W2a or W2b to the opposite ends c1 and c2 having a concave shape in the diffusion layer D2.

$$D' = d1' + 2 \cdot d2' + 2 \cdot d3'$$

In this case, since the gap d2' is equal to the gap d2 of FIG. 5A, the distance d3' is smaller than the distance d3 of FIG. 5A due to the arrangement of the contact lines C2b and C2c. In other words, in the case of the conventional layout as shown in FIG. 5A, since an element isolation region is formed between the diffusion layers D1a and D2b, it is necessary to have a gap d4 between the contact C1b and the end of the diffusion layer D1a, and between the contact C1c and the end of the diffusion layer D1b corresponding to a specified value of the design rules. In contrast thereto, according to the layout of FIG. 5B, an element isolation region is not formed, and it is not necessary to consider the gap between the contact and the end of the diffusion layer. Therefore, the distance d3' can be smaller than the distance d3. Further, although the line width d1' changes due to film forming conditions on the N-channel or P-channel or the like in the manufacturing process, the entire distance D' is substantially equal to or slightly smaller than the distance D of FIG. 5A.

As described above, in the area of the circuit portion including only the conventional inverters, it is possible in this embodiment to form the circuit portion including both the inverters and the driver. That is, in the case of disposing the driver circuit on a chip in the conventional configuration, it is necessary to consider overhead in area. In contrast thereto, in this embodiment, such overhead does not occur, and the inverters and the driver can be integrally disposed. Accordingly, when forming an inverter circuit employing the standby current reduction method, it is possible to improve the space efficiency remarkably.

Figure 6:
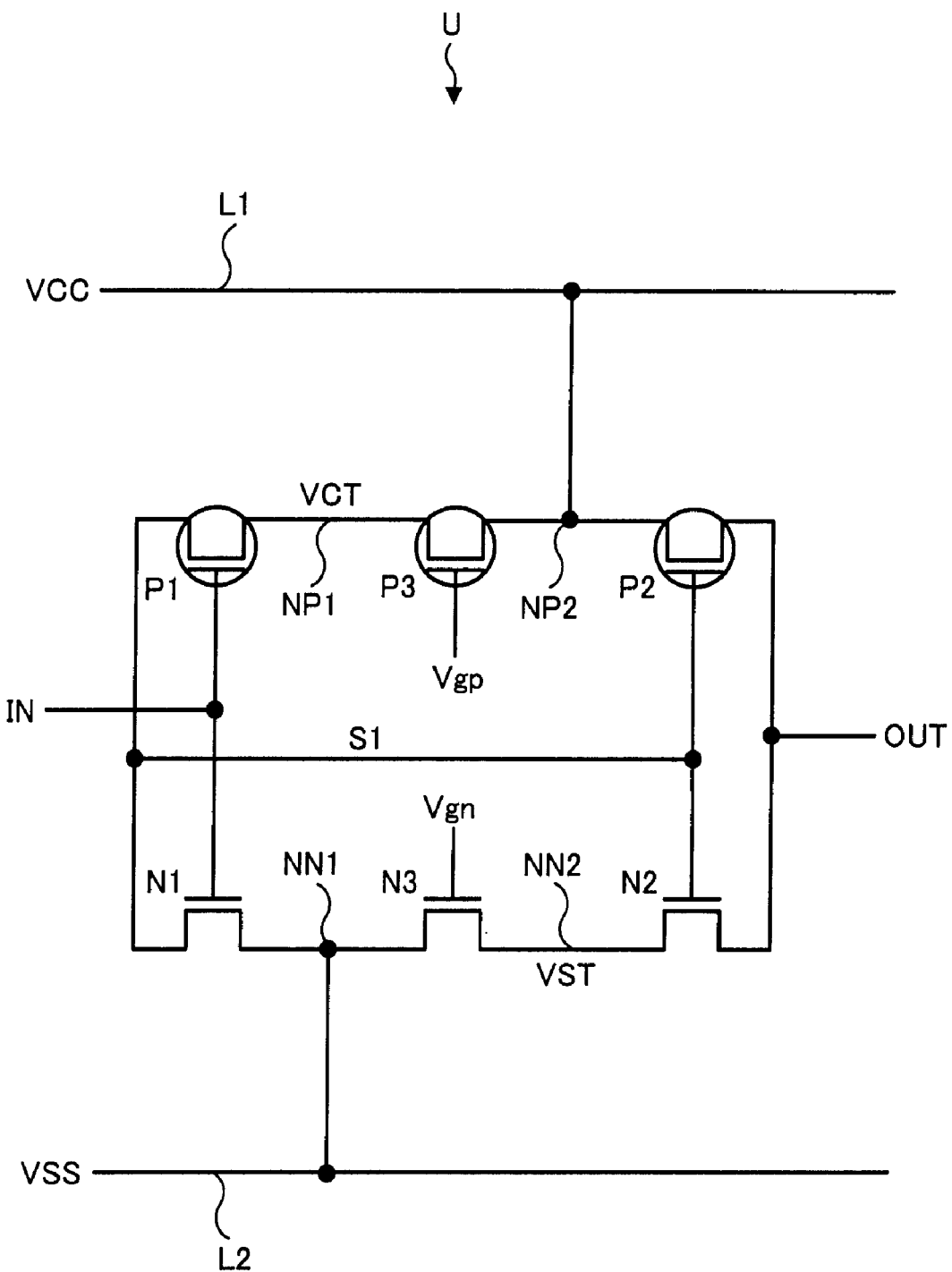
FIG. 6 is a diagram showing a circuit configuration corresponding to FIG. 2 in a modification applied to the inverter circuit of the embodiment.

The above-mentioned configuration of this embodiment has various modifications. In the aforementioned embodiment, the circuit configuration and the layout of the inverter circuit in which the output signal OUT is low corresponding to the configuration of FIG. 1B has been described. However, a modification applied to the inverter circuit in which the output signal OUT is high corresponding to the configuration of FIG. 1A will be described. FIG. 6 shows a circuit configuration of this modification corresponding to FIG. 2. The configuration of FIG. 6 differs from the configuration of FIG. 2 in that the main power supply line L1 is connected to the node NP2 and the sub-power supply voltage VCT is generated at the node NP1, and in that the main ground line L2 is connected to the node NN1 and the sub-ground voltage VST is generated at the node NN2.

Figure 7:
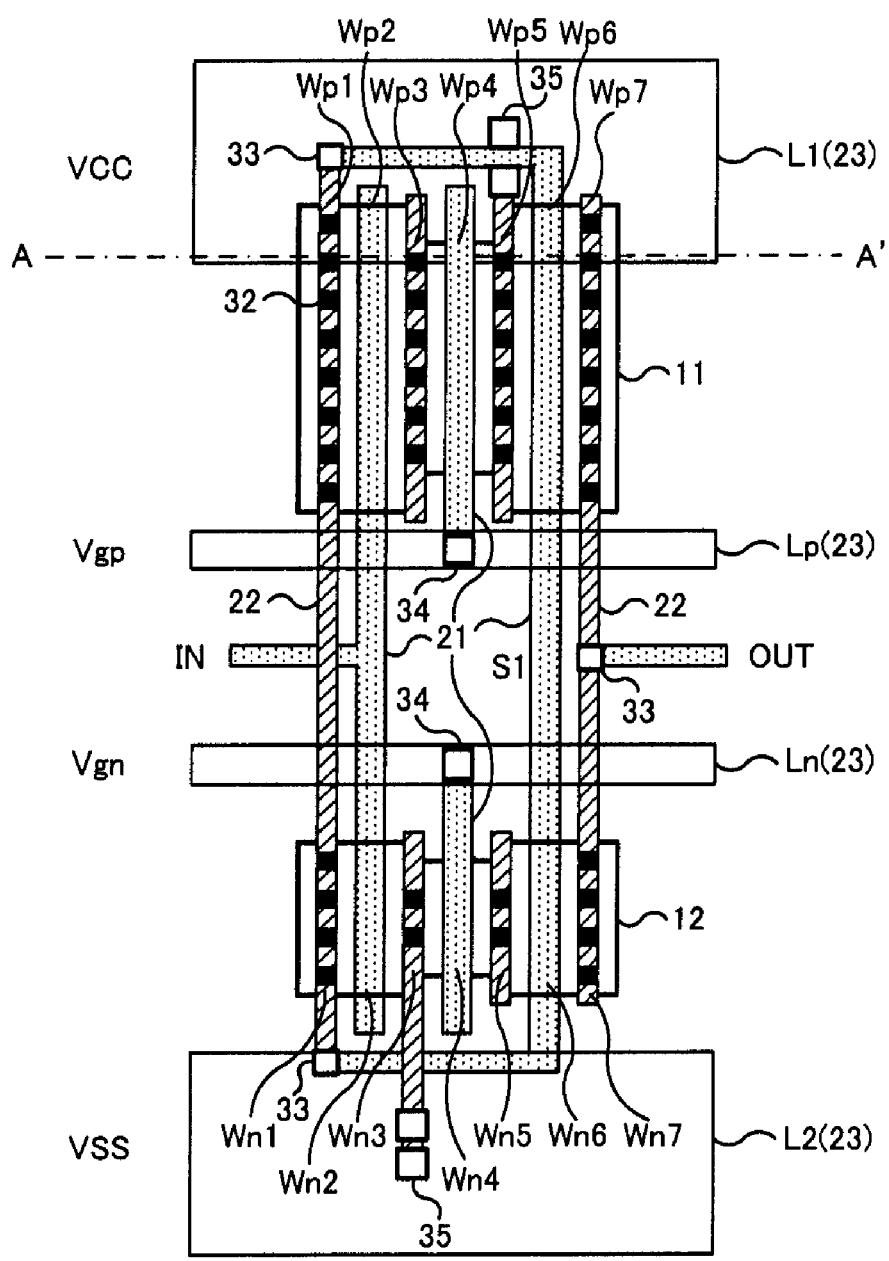
FIG. 7 is a diagram showing a layout corresponding to the layout of FIG. 3 in the modification applied to the inverter circuit of the embodiment.

FIG. 7 shows a layout of this modification corresponding to the layout of FIG. 3. The layout of FIG. 7 differs from the layout of FIG. 3 in that the via 35 on the P-channel side is formed in the wiring portion Wp5 instead of the wiring portion Wp3, and in that the via 35 on the N-channel side is formed in the wiring portion Wn3 instead of the wiring portion Wn5. In this manner, only by changing positions of the vias 35 in the manufacturing process, the inverter circuit corresponding to the configuration of FIG. 1B can be changed to the inverter circuit corresponding to the configuration of the FIG. 1A with ease.

Although the inverter circuit having the circuit configuration corresponding to the standby current reduction method is described in this embodiment, the present invention is also applicable to a circuit configuration employing a method other than the standby current reduction method by changing the layout. For example, a compensation capacitor may be formed by short-circuiting between the source and drain of the PMOS transistor P3 or the NMOS transistor N3 for the driver on the P-channel or N-channel side. It is also possible to form compensation capacitors both on the N-channel and P-channel sides. In this case, since the circuit configuration can be realized only by changing positions of the vias 35 in the manufacturing process, the modification is easily applicable in accordance with the usage of the semiconductor device.

In the foregoing, the present invention is described specifically based on this embodiment. However, the present invention is not limited to the above-mentioned embodiment, and can be carried into practice with various modifications without departing from the subject matter thereof. For example, in this embodiment, the case in which the present invention is applied to the inverter circuit of the semiconductor device has been described, but the present invention is not limited to the inverter circuit, and is widely applicable to semiconductor devices having various types of logic circuits to which the power-supply voltage VCC, the ground voltage VSS, the sub-power supply voltage VCT, and the sub-ground voltage VST are supplied.

Further, in this embodiment, the configuration in which the power-supply voltage VCC, the sub-power supply voltage VCT, the ground voltage VSS, and the sub-ground voltage VST are supplied to the logic circuit, but the present invention is also applicable to a configuration in which a first voltage V1, a first sub-voltage Vs1, a second voltage V2 and a second sub-voltage Vs2 each as general power supply system are supplied. In this case, the power supply systems should be formed so as to satisfy the following relationship:

$$V1 > Vs1 > Vs2 > V2$$

The present invention is not limited to the above described embodiments, and various variations and modifications may be possible without departing from the scope of the present invention.

This application is based on the Japanese Patent application No. 2006-115029 filed on Apr. 18, 2006, entire content of which is expressly incorporated by reference herein.

What is claimed is:

1. A semiconductor device comprising:
a logic circuit including a plurality of MOS transistors to which a power supply voltage and a sub-power supply voltage lower than said power supply voltage are supplied at a power supply side and to which a ground voltage and a sub-ground voltage higher than said ground voltage are supplied to at a ground side;
a main power supply line for supplying said power supply voltage; and
a main ground line for supplying said ground voltage,
wherein a unit circuit constituting said logic circuit includes:
a first PMOS transistor;
a second PMOS transistor;
a third PMOS transistor connected between a source of said first PMOS transistor and a source of said second PMOS transistor, one connection node of which is connected to said main power supply line, while at an other connection node of which said sub-power supply voltage is generated;
a first NMOS transistor;
a second NMOS transistor; and
a third NMOS transistor connected between a source of said first NMOS transistor and a source of said second NMOS transistor, one connection node of which is connected to said main ground line, while at an other connection node of which said sub-ground voltage is generated,
wherein
a first diffusion layer in which said third PMOS transistor and said first and second PMOS transistors at opposite sides thereof are arranged;
a second diffusion layer in which said third NMOS transistor and said first and second NMOS transistors at opposite sides thereof are arranged;
a first wiring layer including a wiring of each gate of said MOS transistors;
a second wiring layer including a wiring of each drain/source of said MOS transistors; and
a third wiring layer including said main power supply line and said main ground line are stacked on a semiconductor substrate.

2. A semiconductor device according to claim 1, wherein said third PMOS transistor is arranged at a center of said first diffusion layer, and said third NMOS transistor is arranged at a center of said second diffusion layer.

3. A semiconductor device according to claim 1, wherein in said second wiring layer above said first diffusion layer, a wiring portion shared by said first and third PMOS transistors and a wiring portion shared by said second and third PMOS transistors are arranged, and
wherein in said second wiring layer above said second diffusion layer, a wiring portion shared by said first and third NMOS transistors and a wiring portion shared by said second and third NMOS transistors are arranged.

4. A semiconductor device according to claim 1, wherein said logic circuit is an inverter circuit of predetermined stages comprising said unit circuit including two stage inverters and a driver for driving the inverters, said third PMOS transistor functions as the driver on a P-channel side, and said third NMOS transistor functions as the driver on a N-channel side.

5. A semiconductor device according to claim 4, wherein operation of said third PMOS transistor and said third NMOS transistor is controlled by a control voltage applied to each gate thereof.

6. A semiconductor device according to claim 5, wherein an input signal is applied to commonly connected gates of said first PMOS transistor and said first NMOS transistor, commonly connected drains of said first PMOS transistor and said first NMOS transistor are connected to commonly connected gates of said second PMOS transistor and said second NMOS transistor, and an output signal is output from commonly connected drains of said second PMOS transistor and said second NMOS transistor.

7. A semiconductor device according to claim 6, wherein the connection node of said third PMOS transistor at a side of said first PMOS transistor is connected to said main power supply line, and the connection node of said third NMOS transistor at a side of said second NMOS transistor is connected to said main ground line.

8. A semiconductor device according to claim 7, wherein said inverter circuit is controlled such that said output signal is low in standby operation.

9. A semiconductor device according to claim 6, wherein the connected node of said third PMOS transistor at a side of said second PMOS transistor is connected to said main power supply line, and the connection node of said third NMOS transistor at a side of said first NMOS transistor is connected to said main ground line.

10. A semiconductor device according to claim 9, wherein said inverter circuit is controlled such that said output signal is high in standby operation.

11. A semiconductor device comprising:
a first transistor coupled between a first power supply line and a first node, and having a first gate electrode elongated in a first direction and coupled to an input node;
a second transistor coupled between an output node and a second node, and having a second gate electrode elongated in said first direction and coupled to said first node; and
a third transistor coupled between said first power supply line and said second node, and having a third gate electrode elongated in said first direction and formed between said first and second gate electrodes.

12. The semiconductor device according to claim 11, further comprising:
a fourth transistor coupled between said first node and third node, and having a fourth gate electrode elongated in a second direction and coupled to said input node;
a fifth transistor coupled between a second power supply line and said output node, and having a fifth gate electrode elongated in said second direction and coupled to said first node; and
a sixth transistor coupled between said second power supply line and said third node, and having a sixth gate electrode elongated in said second direction and formed between said fourth and fifth gate electrodes.

13. The semiconductor device according to claim 11, wherein said first transistor has a diffusion area combining with one diffusion area of said third transistor, and
said second transistor has a diffusion area combining with the other diffusion area of said third transistor.

14. The semiconductor device according to claim 12, wherein said fourth transistor has a diffusion area combining with one diffusion area of said sixth transistor, and
said fifth transistor has a diffusion area combining with the other diffusion area of said sixth transistor.

15. The semiconductor device according to claim 12, wherein each of said first, second and third transistors is a transistor having a first conductivity type, and
each of said fourth, fifth and sixth transistors is a transistor having a second conductivity type opposite to said first conductivity type.

16. The semiconductor device according to claim 12, wherein said second direction is said first direction.

* * * * *